US009899508B1

(12) United States Patent
Schillaci et al.

(10) Patent No.: US 9,899,508 B1
(45) Date of Patent: Feb. 20, 2018

(54) SUPER JUNCTION SEMICONDUCTOR DEVICE FOR RF APPLICATIONS, LINEAR REGION OPERATION AND RELATED MANUFACTURING PROCESS

(71) Applicant: STMicroelectronics S.r.l., Agrate Brianza (IT)

(72) Inventors: Antonino Schillaci, Messina (IT);
Paola Maria Ponzio, Gela (IT);
Alessandro Angelo Alfio Palazzo, San Giovanni La Punta (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 15/289,828

(22) Filed: Oct. 10, 2016

(51) Int. Cl.
| H01L 29/66 | (2006.01) |
| H01L 29/78 | (2006.01) |
| H01L 21/265 | (2006.01) |
| H01L 29/10 | (2006.01) |
| H01L 29/08 | (2006.01) |

(52) U.S. Cl.
CPC ........ *H01L 29/7802* (2013.01); *H01L 21/265* (2013.01); *H01L 29/0865* (2013.01); *H01L 29/0882* (2013.01); *H01L 29/1095* (2013.01); *H01L 29/66545* (2013.01); *H01L 29/66712* (2013.01)

(58) Field of Classification Search
USPC .................. 257/135–136, 242, 329, E27.091, 257/E27.095–E27.096, E29.118, E29.274, 257/E29.262, E27.41, E21.629, 341, 330, 257/493, E21.643; 438/136, 137, 156, 438/173, 192
See application file for complete search history.

(56) References Cited

U.S. PATENT DOCUMENTS

| 6,228,719 B1 | 5/2001 | Frisina et al. |
| 6,300,171 B1 | 10/2001 | Frisina |
| 6,404,010 B2 | 6/2002 | Saggio et al. |
| 6,586,798 B1 | 7/2003 | Frisina |
| 6,677,643 B2 | 1/2004 | Iwamoto et al. |
| 9,136,381 B1 | 9/2015 | Kocon et al. |
| 9,368,617 B2 | 6/2016 | Hirler et al. |
| 2011/0233714 A1* | 9/2011 | Lu .................... H01L 29/66348 257/493 |

(Continued)

*Primary Examiner* — Tram H Nguyen
(74) *Attorney, Agent, or Firm* — Seed Intellectual Property Law Group LLP

(57) ABSTRACT

Embodiments are directed to super-junction semiconductor devices having an inactive region positioned between active cells. In one embodiment, a semiconductor device is provided that includes a substrate and a drain region on the substrate. The drain region has a first conductivity type. A plurality of first columns is disposed on the drain region, with the first columns having the first conductivity type. A plurality of second columns is disposed on the drain region, with the second columns having a second conductivity type. The first and second columns are alternately arranged such that each of the second columns is positioned between respective first columns. First and second gate structures are included that overlie respective first columns, and a body region is included that has the second conductivity type. The body region abuts at least two second columns and at least one first column positioned between the at least two second columns.

22 Claims, 10 Drawing Sheets

(56) References Cited

U.S. PATENT DOCUMENTS

| | | |
|---|---|---|
| 2012/0086076 A1 | 4/2012 | Takei |
| 2013/0149838 A1 | 6/2013 | Saggio et al. |
| 2015/0145038 A1 | 5/2015 | Willmeroth et al. |
| 2016/0268369 A1* | 9/2016 | Ichimura ............. H01L 29/0634 |

* cited by examiner

| DEVICE | STRIPS OFF/ON | FREQ. (MHz) | Vdd (V) | CLASS OPERATION–CW | Pout (W) | Pgain (dB) | η (%) | VSWR | NOTES |
|---|---|---|---|---|---|---|---|---|---|
| SUPER JUNCTION (STD TECHNOLOGY) | — | 13.56 | 300 | CLASS C | 1KW | 24 | 90 | 5:1 | FAIL IN CLASS C CW & PULSED MODE |
|  |  |  |  | CLASS AB |  |  |  |  | UNABLE CLASS AB |
| SUPER JUNCTION | 2/1 | 13.56 | 150 | CLASS C | 450 | 22 | 76.8 | 10:1 |  |
|  |  |  |  | CLASS AB | 450 | 28.9 | 74.8 | 3:1 |  |
| SUPER JUNCTION | 3/1 | 13.56 | 150 | CLASS C | 500 | 22 | 72 | 10:1 |  |
|  |  |  |  | CLASS AB | 500 | 31 | 70 | 6:1 |  |
| SUPER JUNCTION | 4/1 | 13.56 | 150 | CLASS AB | 300 | 32 | 65 | 40:1 |  |

FIG. 3

SUPER JUNCTION SEMICONDUCTOR DEVICE FOR RF APPLICATIONS, LINEAR REGION OPERATION AND RELATED MANUFACTURING PROCESS

BACKGROUND

Technical Field

The present disclosure is generally directed to super-junction semiconductor devices, and more particularly, to super-junction semiconductor devices capable of operating in Radio Frequency applications.

Description of the Related Art

A wide range of solutions have been developed in recent years to increase the efficiency of semiconductor power devices, in particular, in terms of increasing the corresponding breakdown voltage and reducing the corresponding output resistance.

One such development includes vertical-conduction semiconductor power devices, in which, within an epitaxial layer, which forms part of a drain region having a given type of conductivity (for example a conductivity of an n-type), columnar structures of opposite conductivity (in the example, a conductivity of a p-type) are provided. The columnar structures have a concentration of dopants such as to balance the amount of charge of the epitaxial layer in such a way as to create a substantial charge balance (so-called multi-drain or super-junction technology).

This charge balance enables high breakdown voltages to be obtained, as the value of the breakdown voltage (BV) of a semiconductor device has a maximum at a point corresponding to a perfect charge balance in the corresponding drain layer. In addition, the high concentration of the epitaxial layer enables a low output resistance to be obtained.

Manufacturing of the columnar structures in a standard super-junction semiconductor device may include sequential growth of epitaxial layers, for example of an n-type material, followed by implantation of dopants of an opposite type, e.g., p-type material. The implanted regions are stacked so as to form the columnar structures. Body regions of the super-junction semiconductor device are then provided in contact with the p-type columnar structures, in such a way that the columnar structures constitute an extension of the body regions within the drain region.

While super-junction semiconductor devices have proved useful in some applications, such devices have not been successfully implemented, or even implemented at all, in Radio Frequency (RF) applications.

FIG. 1 is a cross-sectional view of a conventional super-junction semiconductor device 10, as known in the art. The device 10 includes a drift layer 16 that includes alternating columns of p-type and n-type semiconductor material (i.e., p-type columns 15 and n-type columns 17) that are formed on an n-type drain layer 14. P-type body regions 18 are positioned directly on top of respective p-type columns 15, and n-type source regions 20 are formed in respective body regions 18. The device 10 further includes gate electrodes 22 formed over respective n-type columns 17. A plurality of cells 1 (e.g., transistors) are thus formed in the device 10, with each cell 1 including a gate electrode 22 overlying an associated n-type column 17, and source regions 20 formed in adjacent body regions 18 which are in direct contact with respective p-type columns 15. The cells 1 are activated by application of a voltage to the gate electrode 22, which facilitates the flow of a drain-source current ($I_{DS}$) between the drain layer 14 and the source regions 20, e.g., through the n-type column 17 and associated body regions 18.

The conventional super-junction semiconductor device 10 shown in FIG. 1, while suitable for certain applications, is generally unsuitable for RF applications. That is, for a pre-fixed die size, the implementation of an appropriate RF layout does not constitute necessary and sufficient conditions to ensure the proper working at Radio Frequency of a standard super-junction semiconductor device, since the high intrinsic power density of such super-junction devices would lead to thermal destructive effects at Radio Frequency. For example, using a conventional super-junction semiconductor device (e.g., device 10 of FIG. 1) in RF applications results in the formation of closely packed isotherms (e.g., regions of high current density) in the active n-type columns 17, thereby limiting the effectiveness of such devices in RF applications.

BRIEF SUMMARY

The present disclosure is generally directed to super-junction semiconductor devices, and methods for forming such devices, that include an inactive region formed between active regions or cells of the device. The inactive region includes at least one inactive column of semiconductor material that abuts an extended body region spanning across the inactive region. During operation of such super-junction semiconductor devices, particularly at radio frequency, formation of isotherms (i.e., high current density regions within active columns) is prevented in the inactive region of the device, thereby providing better thermal stability and overall functioning as compared to standard super-junction semiconductor devices.

In one embodiment, the present disclosure provides a semiconductor device that includes a drain region having a first conductivity type that is formed on a substrate. A plurality of first columns having the first conductivity type is formed on the drain region, and a plurality of second columns having a second conductivity type is formed on the drain region. The first and second columns are alternately arranged such that each of the second columns is positioned between respective first columns. First and second gate structures overlie respective first columns. The semiconductor device further includes a body region having the second conductivity type that abuts at least two second columns and at least one first column positioned between the at least two second columns.

In another embodiment, the present disclosure provides a semiconductor device that includes first and second super-junction transistors. Each of the first and second super-junction transistors includes a respective gate structure overlying a respective first column having a first conductivity type, and a respective pair of second columns having a second conductivity type. The respective first column is sandwiched between the respective pair of second columns. An inactive region is positioned between the first and second super-junction transistors, and includes at least one inactive column having the first conductivity type. A body region extends between the respective first columns of the first and second super-junction transistors and abuts the at least one column of the inactive region.

In yet another embodiment, the present disclosure provides a method that includes: forming a first gate structure over a first column of semiconductor material having a first conductivity type, the first column being sandwiched between a first pair of columns of semiconductor material having a second conductivity type; forming a second gate structure over a second column of semiconductor material having the first conductivity type, the second column being sandwiched between a second pair of columns of semiconductor material having the second conductivity type; and forming a body region extending between the first and second columns of semiconductor material having the first conductivity type, the body region abutting a third column of semiconductor material having the first conductivity type that is positioned between the first and second pairs of columns of semiconductor material having the second conductivity type.

BRIEF DESCRIPTION OF THE SEVERAL VIEWS OF THE DRAWINGS

FIG. 3 is a table comparing experimental results obtained using a standard super-junction device with embodiments of super-junction devices provided by the present disclosure.

DETAILED DESCRIPTION

Figure 1:
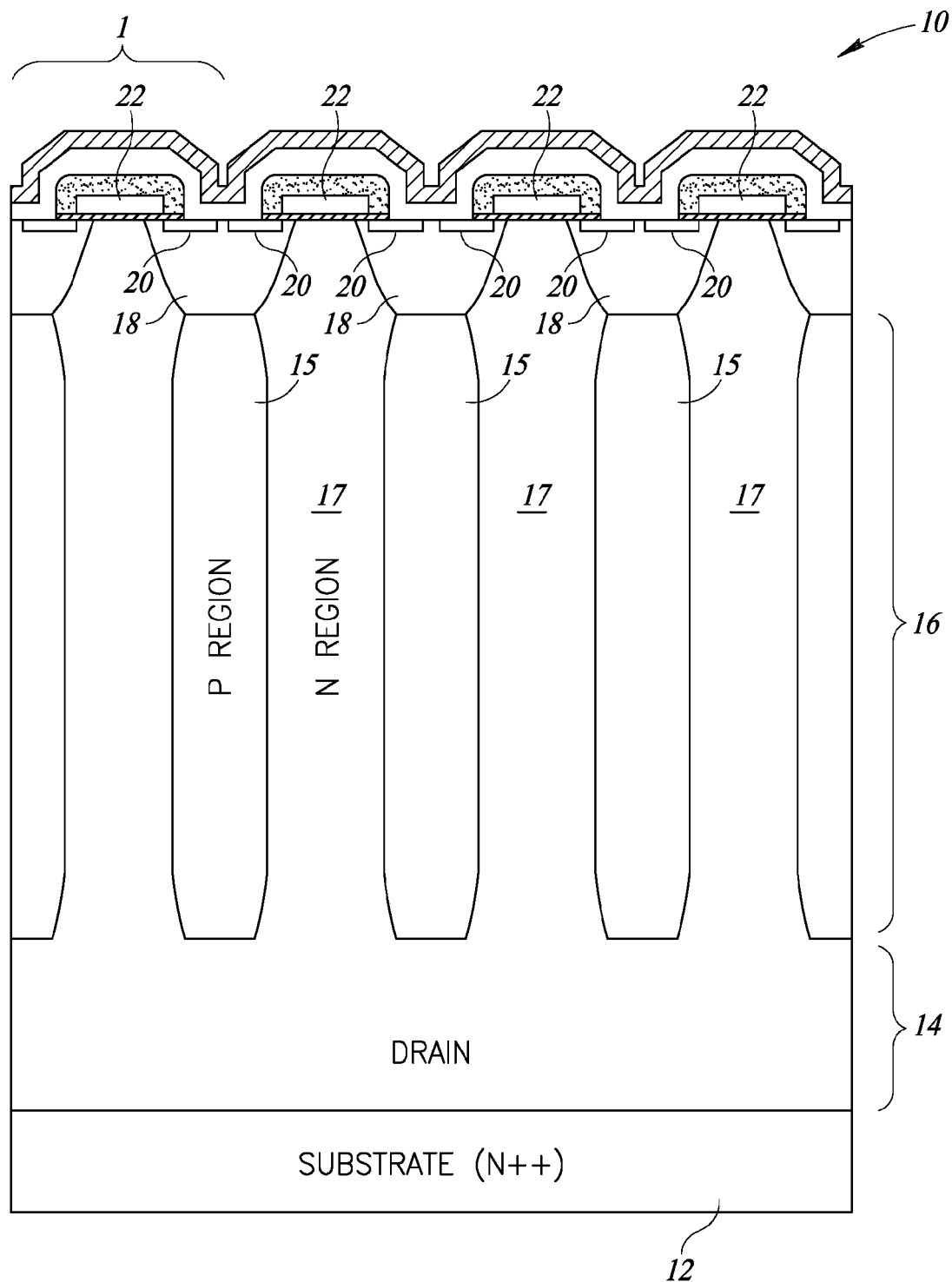
FIG. 1 is a cross-sectional view of a conventional super-junction semiconductor device.

In the following description, certain specific details are set forth in order to provide a thorough understanding of various aspects of the disclosed subject matter. However, the disclosed subject matter may be practiced without these specific details. In some instances, well-known structures and methods of semiconductor processing comprising embodiments of the subject matter disclosed herein have not been described in detail to avoid obscuring the descriptions of other aspects of the present disclosure.

Unless the context requires otherwise, throughout the specification and claims that follow, the word "comprise" and variations thereof, such as "comprises" and "comprising" are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

Throughout the specification, the term "layer" is used in its broadest sense to include a thin film, a cap, or the like, and one layer may be composed of multiple sub-layers.

Reference throughout the specification to conventional deposition techniques for depositing silicon nitride, silicon dioxide, metals, or similar materials includes such processes as chemical vapor deposition (CVD), low-pressure chemical vapor deposition (LPCVD), metal organic chemical vapor deposition (MOCVD), plasma-enhanced chemical vapor deposition (PECVD), plasma vapor deposition (PVD), atomic layer deposition (ALD), molecular beam epitaxy (MBE), electroplating, electro-less plating, and the like. Specific embodiments are described herein with reference to examples of such processes. However, the present disclosure and the reference to certain deposition techniques should not be limited to those described.

Reference throughout the specification to conventional photolithography techniques, known in the art of semiconductor fabrication for patterning various thin films, includes a spin-expose-develop process sequence typically followed by an etch process. Alternatively or additionally, photoresist can also be used to pattern a hard mask (e.g., a silicon nitride hard mask), which, in turn, can be used to pattern an underlying film.

Reference throughout the specification to conventional etching techniques known in the art of semiconductor fabrication for selective removal of polysilicon, silicon nitride, silicon dioxide, metals, photoresist, polyimide, or similar materials includes such processes as wet chemical etching, reactive ion (plasma) etching (RIE), washing, wet cleaning, pre-cleaning, spray cleaning, chemical-mechanical planarization (CMP) and the like. Specific embodiments are described herein with reference to examples of such processes. However, the present disclosure and the reference to certain deposition techniques should not be limited to those described. In some instances, two such techniques may be interchangeable. For example, stripping photoresist may entail immersing a sample in a wet chemical bath or, alternatively, spraying wet chemicals directly onto the sample.

It well known that the design philosophy and methodology for RF-DMOS (double-diffused metal-oxide-semiconductor) devices (i.e., semiconductor devices such as transistors for operation at Radio Frequency (RF)) is very different than for standard PMOS semiconductor devices and technologies.

While the same DC parameters are considered for designs utilizing different types of power MOSFETs (e.g., breakdown voltage (BVdss), on resistance (RDSon), threshold voltage (Vth), drain-to-source current (Ids), transconductance (Gfs), capacity, etc.), the weight to attribute to such parameters depends on the particular application. For RF applications, the weight or relative importance of each DC parameter of a power MOSFET is established as a function of RF applications, and therefore of the amplification classes (e.g., classes AB, C, D, E, etc.).

To design a DMOS device suitable for applications operating at Radio Frequency, the design should not only define a suitable layout, but should also be capable of handling the electrical parameters (DC), as well as the parasitic elements, so as to achieve a suitable balance between RF performance and robustness in mismatching conditions to load (e.g., to achieve a suitable voltage standing wave ratio (VSWR) in RF applications).

While standard super junction semiconductor devices, until now, have been typically used only in low frequency switching applications, in one or more embodiments, the present disclosure provides modified super junction PMOS devices that are suitable for operation in RF for most or all amplification classes. Additionally, such devices exhibit exceptional thermal stability, which facilitates or otherwise ensures proper functioning of the device even in a linear region of operation. Embodiments provided herein utilize super junction technology to achieve high RF performance, which is difficult to achieve with traditional planar semiconductor structures which are typically used in RF applications.

Although embodiments herein are described in relation to high voltage breakdown voltage (BV) applications (e.g., BV>900V to 1000V), the super junction semiconductor devices and methods provided by this disclosure are suitable for operation in all breakdown voltage classes.

Figure 2:
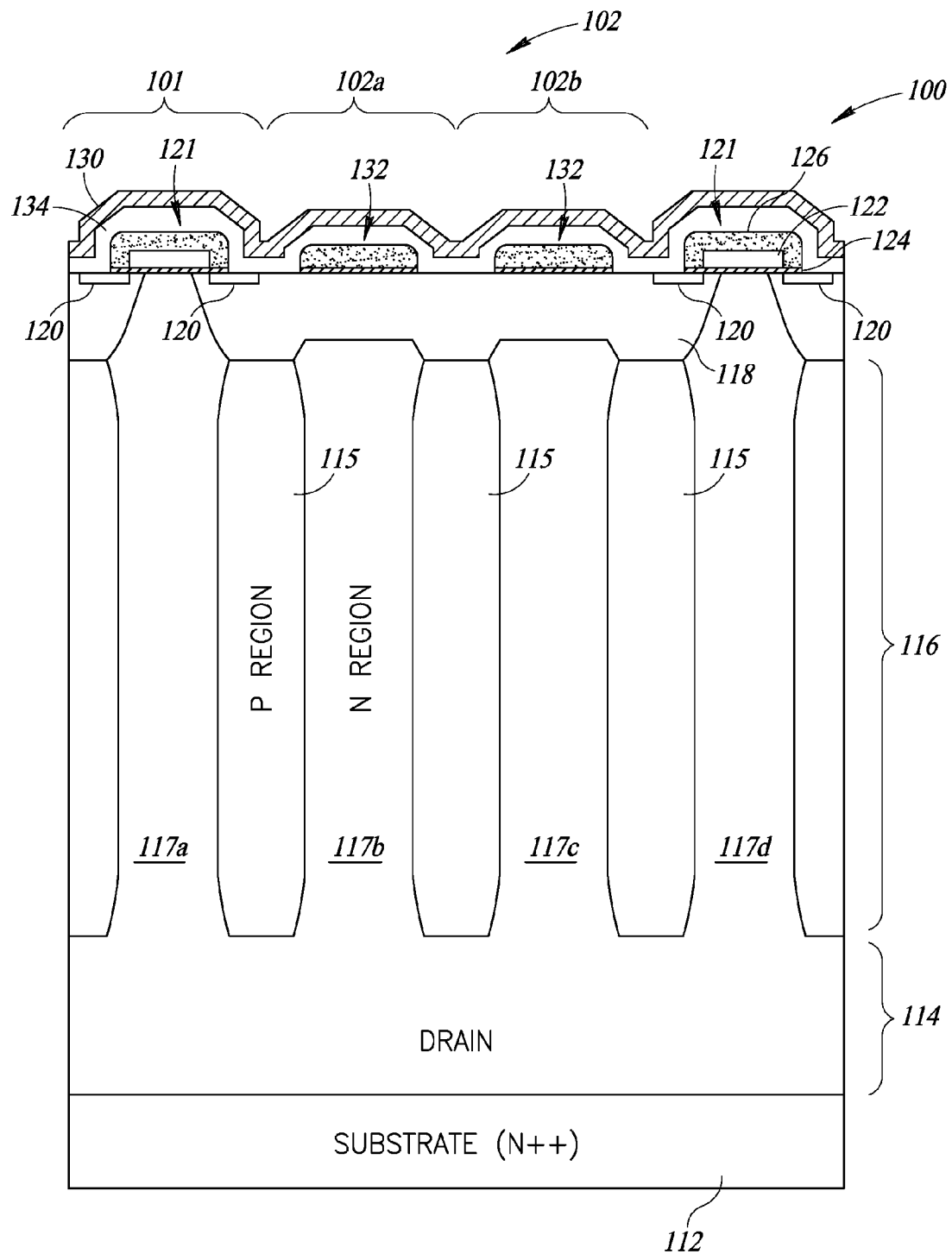
FIG. 2 is a cross-sectional view of a super-junction semiconductor device, in accordance with one or more embodiments of the present disclosure.

FIG. 2 is a cross-sectional view of a super-junction semiconductor device 100 (which may be referred to hereinafter as simply "device 100"), in accordance with one or more embodiments of the present disclosure.

The device 100 includes a substrate 112 and a drain region 114 formed on the substrate 112. A drift layer 116 is formed on the drain region 114, and includes alternating p-type columns 115 and n-type columns 117.

A p-type body region 118 extends between and is coupled to two or more p-type columns 115. As shown in FIG. 2, the body region 118 may extend between and be coupled to three p-type columns 115 (as well as two n-type columns 117b, 117c disposed between respective pairs of p-type columns 115, as shown).

Gate structures 121 are formed over respective n-type columns 117a, 117d, and each gate structure 121 is associated with a pair of source regions 120, as shown in FIG. 2. Each of the gate structures 121 may include a gate electrode 122 that overlies a gate oxide region 124, and a gate dielectric 126 region formed at least partially surrounding the gate electrode 122, as shown.

Active cells 101 (e.g., transistors) are thus formed in regions including a gate structure 121, a pair of associated source regions 120, an n-type column 117a underlying the gate structure 121, and the p-n junctions formed between the n-type column 117a of the active cell 101 and the adjacent p-type body regions 118 (e.g., p-type body regions 118 in which the associated pair of source regions 120 are formed).

Additionally, an inactive region 102 is included in the super-junction semiconductor device 100 shown in FIG. 2. The inactive region 102 includes one or more inactive cells 102a, 102b that are positioned between active cells 101 of the device 100. In particular, the inactive region 102 includes one or more inactive n-type columns 117b, 117c which are formed below (and may be coupled to, as shown in FIG. 2) the extended body region 118 of the device 100. One or more dummy gate structures 132 may be included in the inactive region 102, with each dummy gate structure 132 being associated with (e.g., overlying) a respective inactive n-type column 117b, 117c. The dummy gate structures 132 may include, for example, a gate dielectric region formed over a gate oxide region (as shown); however, a gate electrode 122 is not present in the dummy gate structures 132. That is, as described herein, the term "dummy gate" refers to islands of dielectric material (e.g., the dummy gate structures 132, as shown in FIG. 2) without an associated gate electrode formed of, for example, polysilicon. In one or more embodiments, as will be described in further detail below with reference to FIG. 5, the super-junction semiconductor device 100 may be formed without including the dummy gate structures 132.

In one or more embodiments, a metal layer 134 is included in the device 100 and may be a continuous layer that is coupled to the source regions 120 and/or body regions 118 and overlies the gate dielectric regions 126 of the gate structures 121 and/or dummy gate structures 132. Additionally, in one or more embodiments, a passivation layer 130 may be formed on the metal layer 134. The passivation layer 130 may be, for example, an oxide or nitride layer, and in some embodiments may include a metal oxide.

While FIG. 2 illustrates an embodiment of a super-junction semiconductor device 100 having two inactive cells 102a, 102b provided between active cells 101, in other embodiments, one, three or more inactive cells may be provided between respective active cells 101. For example, a super-junction semiconductor device may include an inactive region 102 having a single inactive cell by forming the p-type body region 118 to extend between only two p-type columns 115 (and only a single inactive n-type column, e.g., n-type column 117b). Such a structure would have a ratio of inactive cells to active cells (during operation) of 1:1. The super-junction semiconductor device 100 shown in FIG. 2 has a ratio of inactive cells to active cells (during operation of the device 100) of 2:1, as the body region 118 extends across two inactive n-type columns 117b, 117c. In alternative embodiments, the super-junction semiconductor device 100 may have a ratio of inactive cells to active cells of 3:1, 4:1, 5:1 or the like by increasing the inactive region 102 between active cells 101 (e.g., by increasing a length of the body region 118 to extend across any number of n-type columns 117, as desired).

During operation of the device 100, isotherms of high current density may form in the n-type columns 117a, 117d of respective active cells 101. However, isotherms do not form in the inactive region 102. Accordingly, thermal stability of the device 100 is improved in comparison with the standard super-junction semiconductor device 10 shown in FIG. 1.

Additionally, the presence of an extended body region 118 spanning between one or more inactive n-type columns (e.g., n-type columns 117b, 117c of inactive cells 102a, 102b, respectively) allows to effectively extend the control on the electric field and to maintain the value and stability of breakdown voltage in the device 100 during operation at Radio Frequency.

FIG. 3 is a table comparing experimental results obtained using a standard super-junction device (such as the device 10 shown in FIG. 1) with embodiments of super-junction devices provided by the present disclosure. The experiments were conducted at Radio Frequency (RF), and in particular, at 13.56 MHz. As shown in FIG. 3, the standard super-junction device has a voltage standing wave ratio (VSWR) of 5:1 when operated in a class C configuration, which results in device failure. The standard super-junction device is unable to operate in the class AB configuration at 13.56 MHz. Embodiments provided by the present disclosure, including super-junction semiconductor devices having a ratio of inactive cells to active cells of 2:1, 3:1 and 4:1, exhibit improved performance at 13.56 MHz RF operation, as shown in FIG. 3. In particular, the VSWR is improved in class C operation to 10:1 for super-junction semiconductor devices having a ratio of inactive cells to active cells of 2:1 and 3:1, which are further capable of performance in class AB operation. For the super-junction semiconductor device having a ratio of inactive cells to active cells of 4:1, the device is capable of performance in class AB operation, with a significantly improved VSWR of 40:1.

FIGS. 4A to 4K illustrate a method of forming a super-junction semiconductor device, such as the super-junction semiconductor device 100 shown in FIG. 2.

Figure 4B:
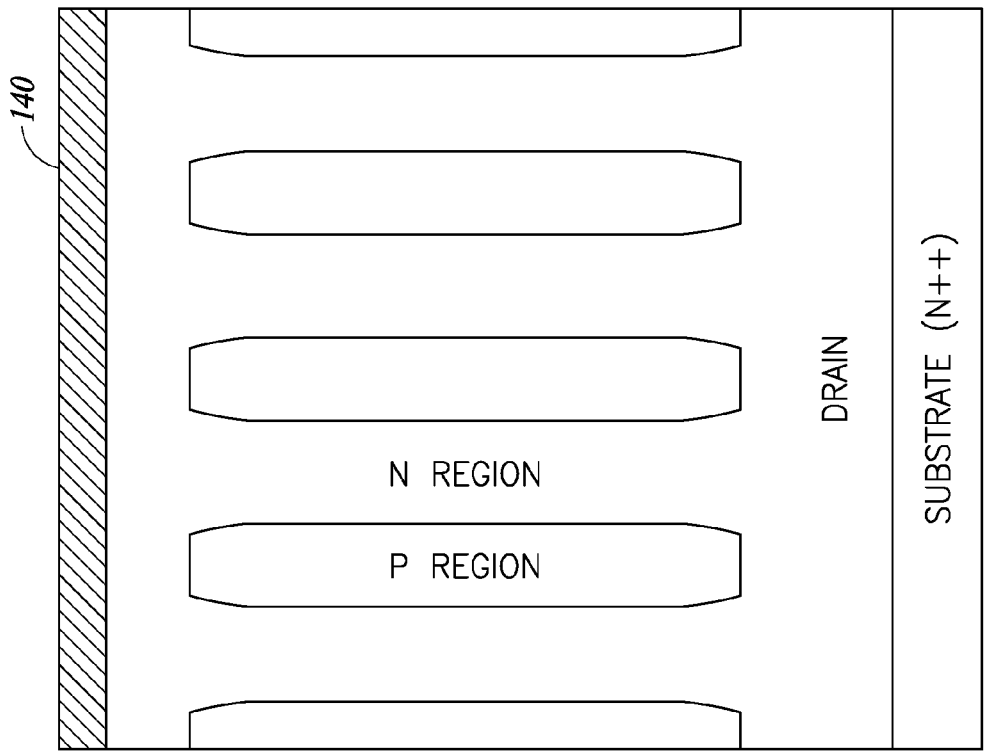
FIGS. 4A to 4K are cross-sectional views illustrating a method of forming the super-junction semiconductor device shown in FIG. 2, in accordance with embodiments of the present disclosure.
Figure 4A:
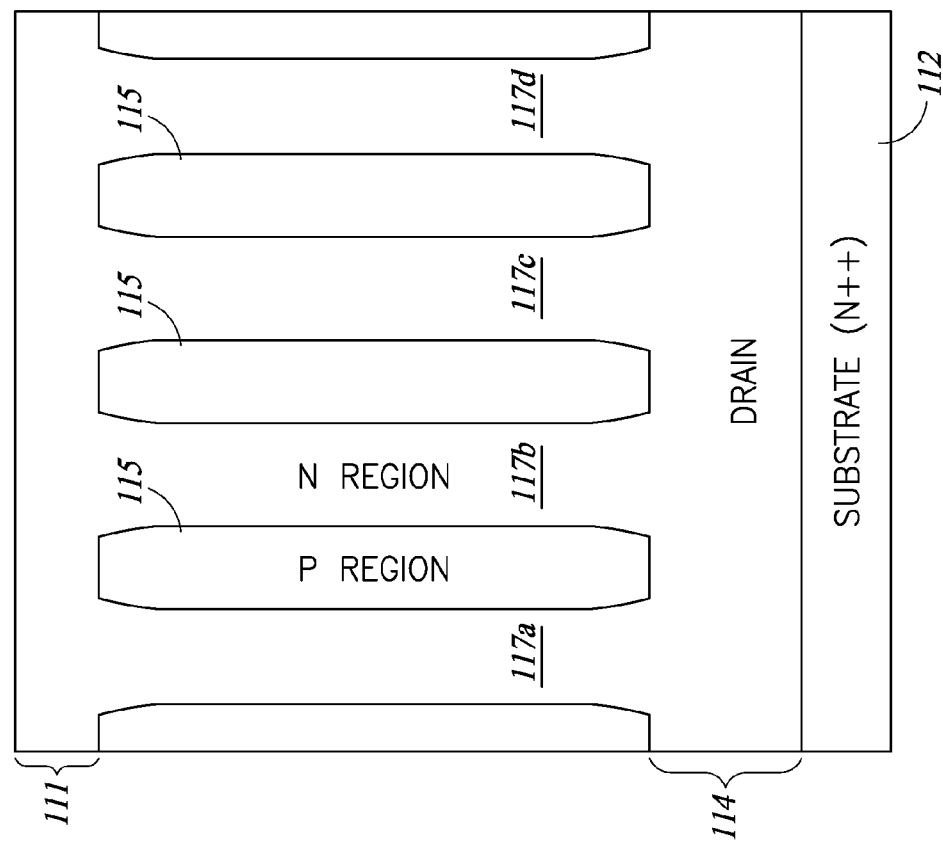

In one or more embodiments, a method for forming a super-junction semiconductor device 100 may begin from the structure shown in FIG. 4A, which includes a plurality of p-type columns 115 and a plurality of n-type columns 117. The p-type and n-type columns 115, 117 are arranged in an alternating fashion such that each p-type column 115 is sandwiched between two n-type columns 117, and each n-type column 117 is similarly sandwiched between two p-type columns 115. The p-type and n-type columns are formed on a drain region 114, which may be formed of n-type semiconductor material. The drain region 114 overlies a substrate 112, which may be formed of a heavily doped (e.g., n++) n-type semiconductor material, as shown. A layer 111 of n-type semiconductor material overlies upper surfaces of the p-type and n-type columns 115, 117.

The substrate may be a semiconductor substrate made of, for example, Si, SiGe, SiC, Ge, GaN, GaAs, AlGaAs, InGaP or any suitable semiconductor material.

The structure shown in FIG. 4A may be formed by any conventional processes for forming a super-junction semiconductor device, including for example, the device 10 shown in FIG. 1. That is, the starting structure shown in FIG. 4A may be a structure which is also formed as part of forming a conventional super-junction semiconductor device 10. Accordingly, the method or process steps leading up to the structure as shown in FIG. 4A will not be described in further detail herein.

As shown in FIG. 4B, a mask layer 140 is formed over the layer 111 of n-type semiconductor material overlying the p-type and n-type columns 115, 117. The mask layer 140 may be a hard mask layer including any suitable material that exhibits etch selectivity over the immediately-adjacent region of the layer 111 of n-type semiconductor material. Some examples of hard mask materials include, but are not limited to, oxides, nitrides, and metals. In some embodiments, the mask layer 140 comprises a silicon oxide or silicon nitride. In some implementations, a soft mask layer, e.g., a polymer-based resist, may be used instead of a hard mask layer. In one or more embodiments, the mask layer 140 may be formed by oxidation growth after a ring diffusion process.

Figure 4D:
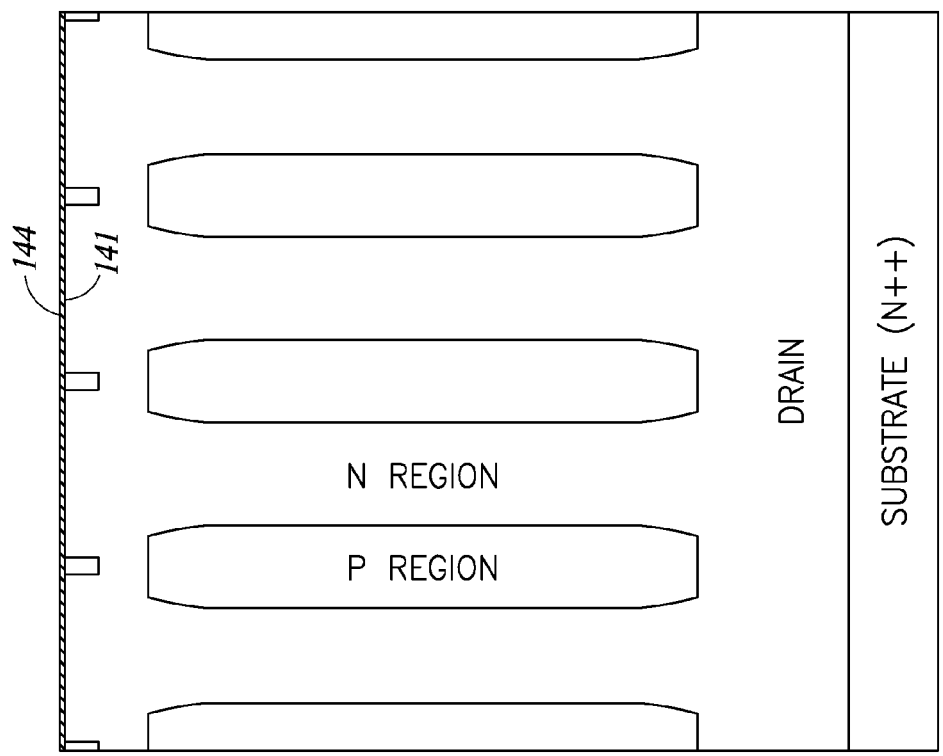
Figure 4C:
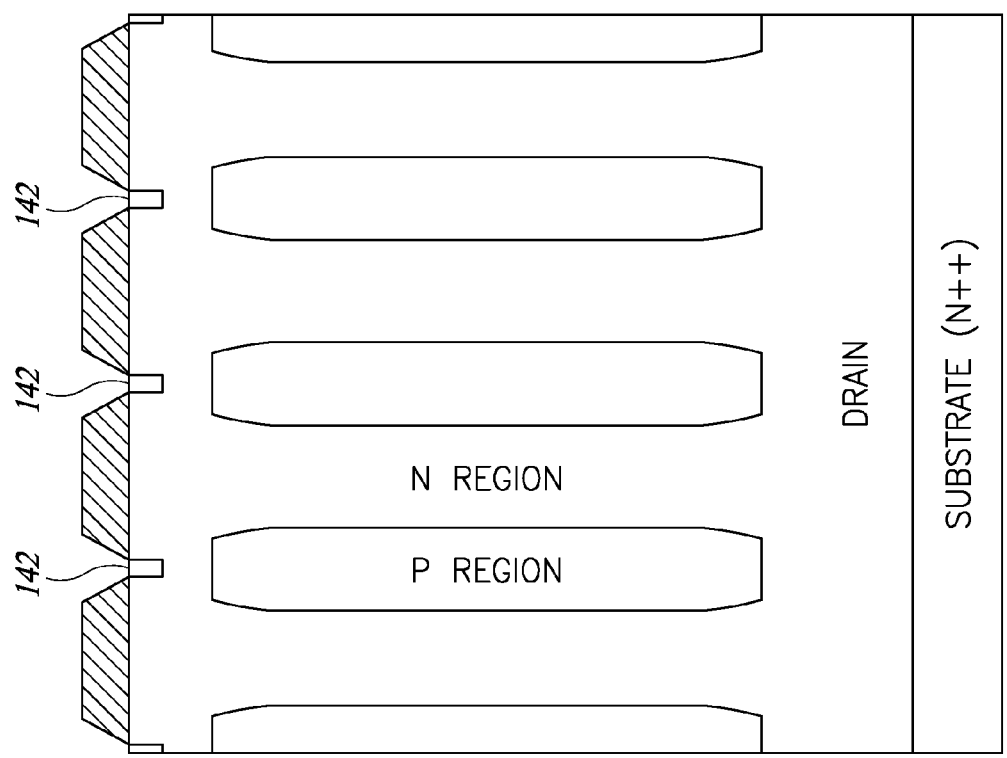

The mask layer 140 is patterned, as shown in FIG. 4C, to expose surface portions of the layer 111 of n-type semiconductor material, with the exposed surface portions being aligned with the p-type columns 115. The patterning may be completed by any suitable lithographic technique, including, for example, photolithography, x-ray lithography, or various techniques of imprint lithography. In one or more embodiments, the mask layer 140 is patterned by photolithography.

Doped regions 142 of p+-type semiconductor material are formed in the layer 111 of n-type semiconductor material that overlays the p-type and n-type columns 115, 117, as shown in FIG. 4C. The doped regions 142 may be formed by implanting positive dopants (such as boron ions, for example) into the n-type semiconductor layer 111 through the openings formed in the mask layer 140. The openings in the mask layer 140 are aligned with the p-type columns 115, and thus the doped regions 142 are formed in the n-type semiconductor layer 111 at positions aligned with the p-type columns 115, as shown. After implanting the positive dopants, the positive dopants may be annealed to drive the dopants to a selected depth to form the dopant regions 142 as desired.

After forming the doped regions 140 of p+-type semiconductor material, the patterned mask layer 140 is removed and, as shown in FIG. 4D, a gate oxide layer 144 is formed over an upper surface 141 of the structure (i.e., an upper surface of the layer 111 of n-type material and the implanted doped regions 142). The gate oxide layer 144 may be formed by thermal oxidation or oxide growth from the upper surface 141 of the layer 111 of n-type material and the implanted doped regions 142. In one or more alternative embodiments, the gate oxide layer 144 may be deposited on the upper surface 141.

Figure 4F:
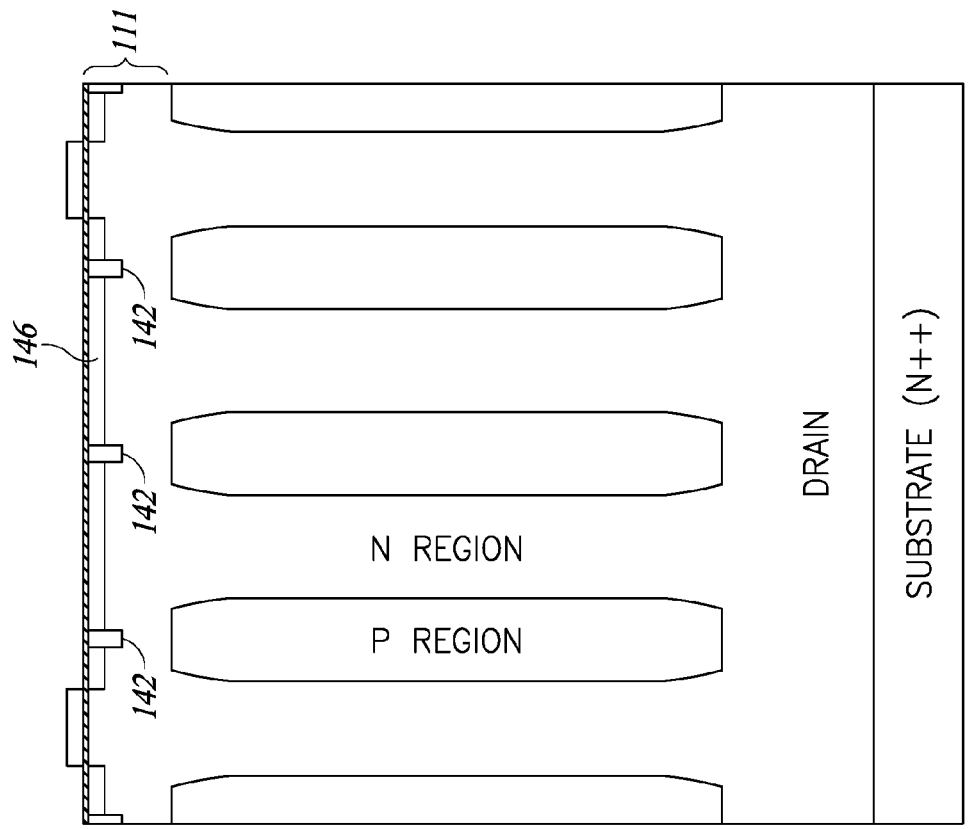
Figure 4E:
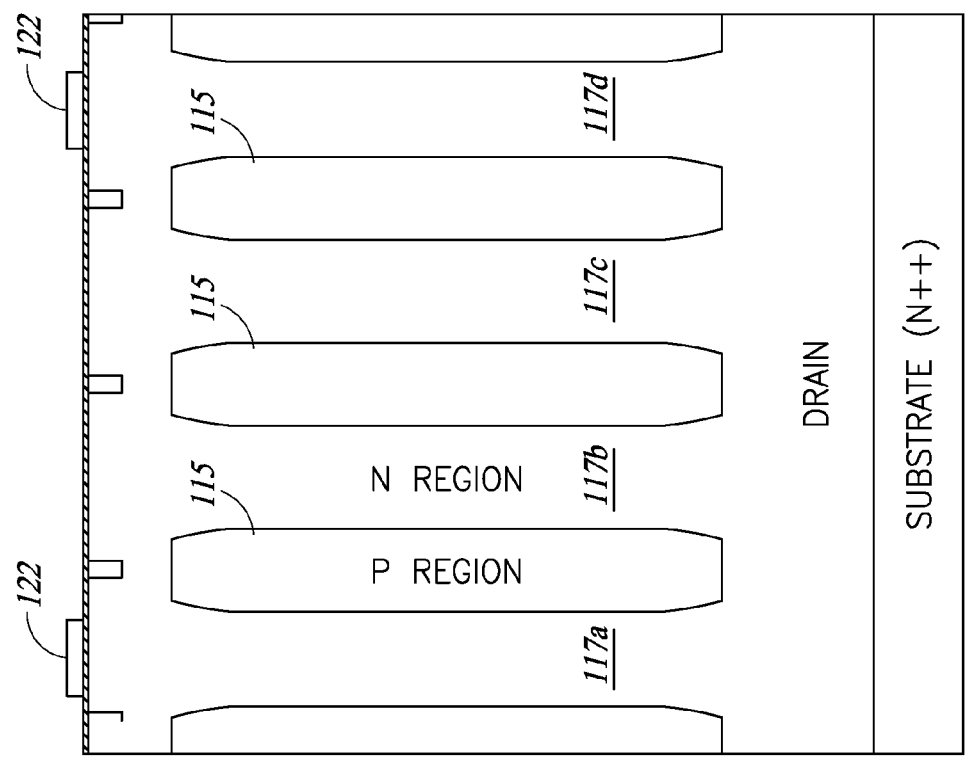

As shown in FIG. 4E, gate electrodes 122 are formed over the gate oxide layer 144, with each gate electrode 122 being aligned with, and overlying, a respective n-type column. In particular, the gate electrodes 122 are formed overlying n-type columns 117a, 117d that are spaced apart from one another by at least one n-type columns. In one or more embodiments, as shown in FIG. 4E, the gate electrodes 122 are formed overlying n-type columns 117a, 117d that are spaced apart from one another by two intervening n-type columns 117b, 117c (as well as three intervening p-type columns, as shown) that do not have an associated overlying gate electrode.

In one or more embodiments, the gate electrodes 122 may be formed of polysilicon. The gate electrodes 122 may be formed, for example, by depositing a polysilicon layer over the gate oxide layer 144 and patterning the deposited polysilicon layer by photolithography to form the gate electrodes 122.

As shown in FIG. 4F, body implant regions 146 are formed in the layer 111 of n-type semiconductor material overlying the p-type and n-type columns 115, 117, and below the gate oxide layer 144. The body implant regions 146 are formed so as to extend between adjacent gate electrodes 122, as shown. In one or more embodiments, the body implant regions 146 may be formed by implanting p-type material (e.g., by implanting positive dopants, such as boron) into the n-type layer 111, with the polysilicon gate electrodes 122 acting as a mask for the body implantation. That is, the body implant regions 146 may be formed by a self-aligned process using the polysilicon gate electrodes 122 as a mask for p-type dopant implantation.

Figure 4H:
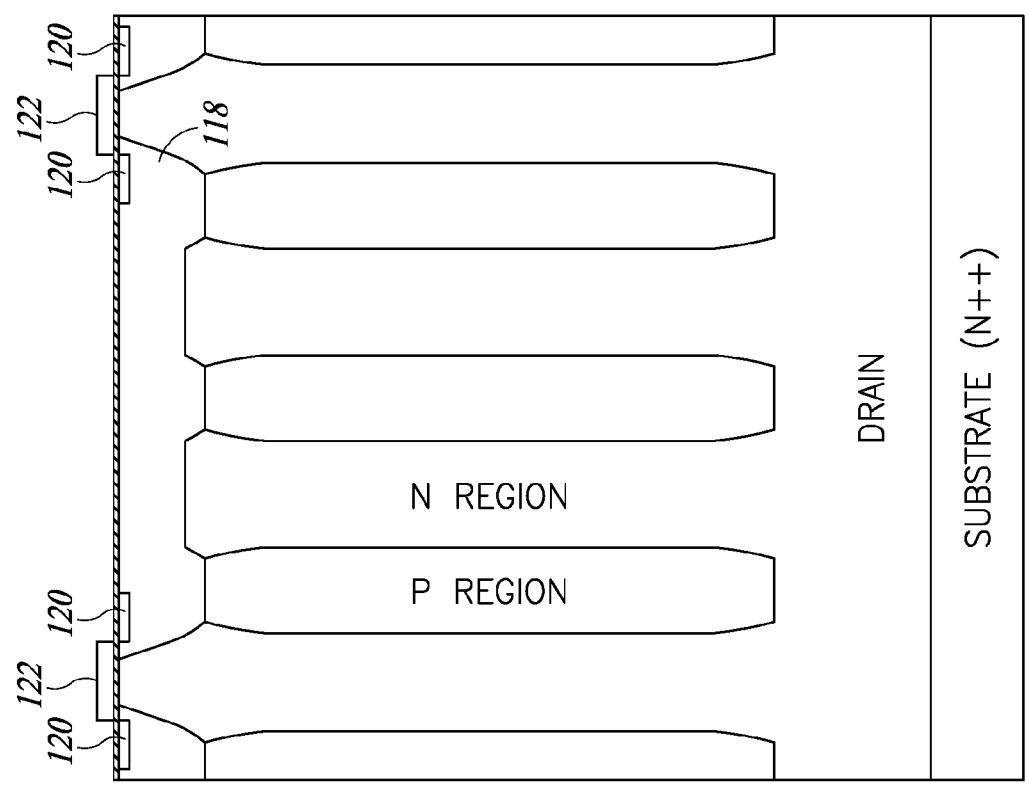
Figure 4G:
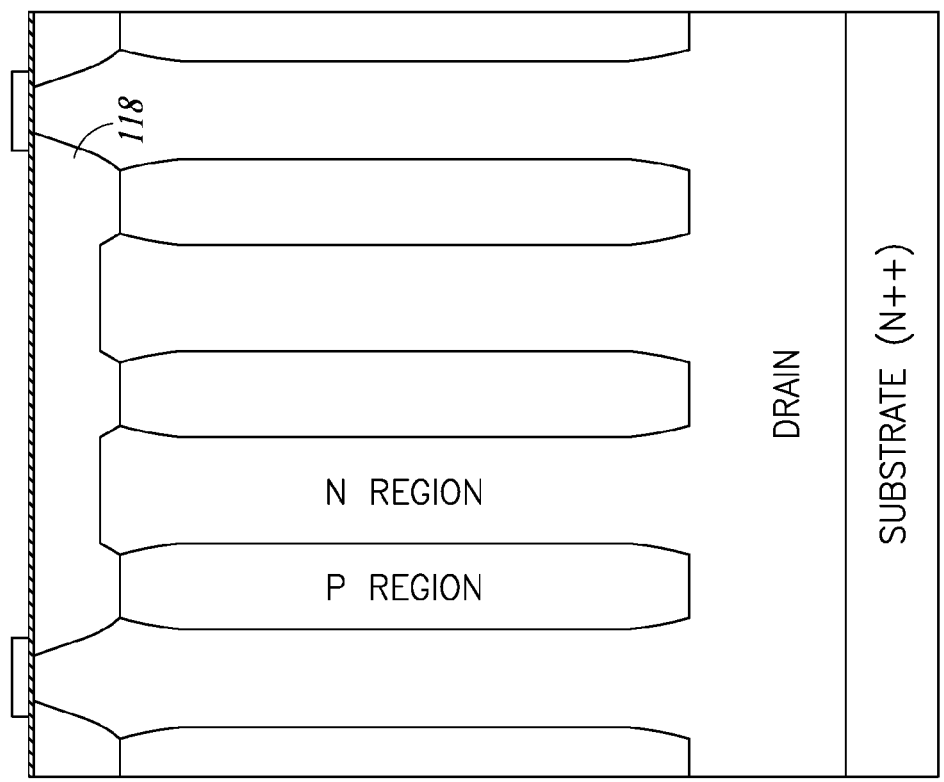

A P-well or body region 118 is formed, as shown in FIG. 4G, by diffusion (e.g., by a drive-in diffusion process) of the p+ dopants (e.g., boron ions) in the P+ regions 142 and the p-type material in the body implant regions 146 to form a substantially homogenous p-type body region 118 that extends into the n-type layer 111 to a suitable depth. The body region 118 may be formed at least partially below and extending between a respective pair of gate electrodes 122, as shown.

As shown in FIG. 4H, n+-type source regions 120 are formed below the gate oxide layer 144 in the p-type body regions 118. The source regions 120 are formed such that each gate electrode 122 is associated with, and proximate to, a respective pair of source regions 120, as shown.

The source regions 120 may be formed by one or more of photolithography, implantation and diffusion processes. For example, in one or more embodiments, the source regions 120 may be formed by depositing a mask layer and then patterning the mask layer by photolithography to leave windows through which the source regions 120 may be formed. N-type dopant material, such as boron ions, is then selectively implanted into the body regions 118 through the windows, and diffused (e.g., by a thermally driven process) to form the source regions 120.

A dielectric layer is formed over the structure shown in FIG. 4H (e.g., by conformal deposition) to cover the gate electrodes 122 and the gate oxide layer 144. As shown in FIG. 4I, gate dielectric regions 126 are then formed by photolithography and an etch process to selectively remove portions of the dielectric layer and the gate oxide layer 144, leaving the gate structures 121 having respective gate dielectric regions 126 over or surrounding respective gate electrodes 122 that are formed on gate oxide regions 124. Additionally, in one or more embodiments, dummy gate structures 132 may be formed, as shown in FIG. 4I. The dummy gate structures 132 can be formed, for example, by retaining (e.g., after photolithography and etching) portions of the gate oxide layer 144 and dielectric layer. The dummy gate structures 132 are formed overlying inactive regions of the super junction semiconductor device 10 (i.e., over inactive n-type columns 117b and 117c, as shown).

Figure 4J:
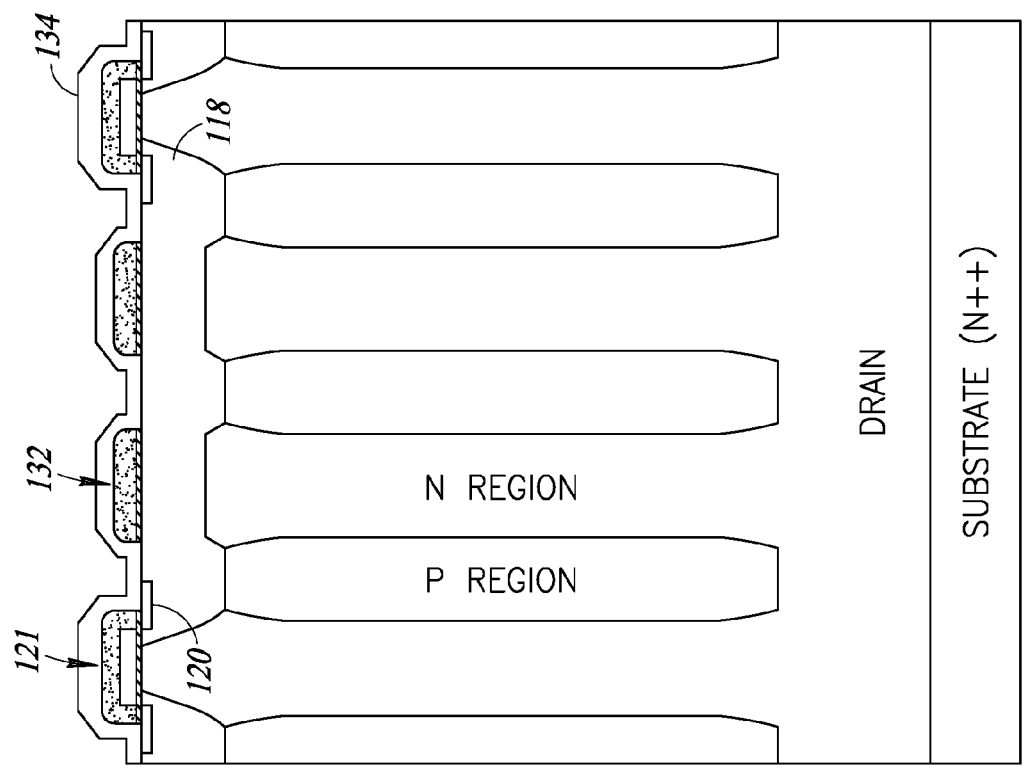
Figure 4I:
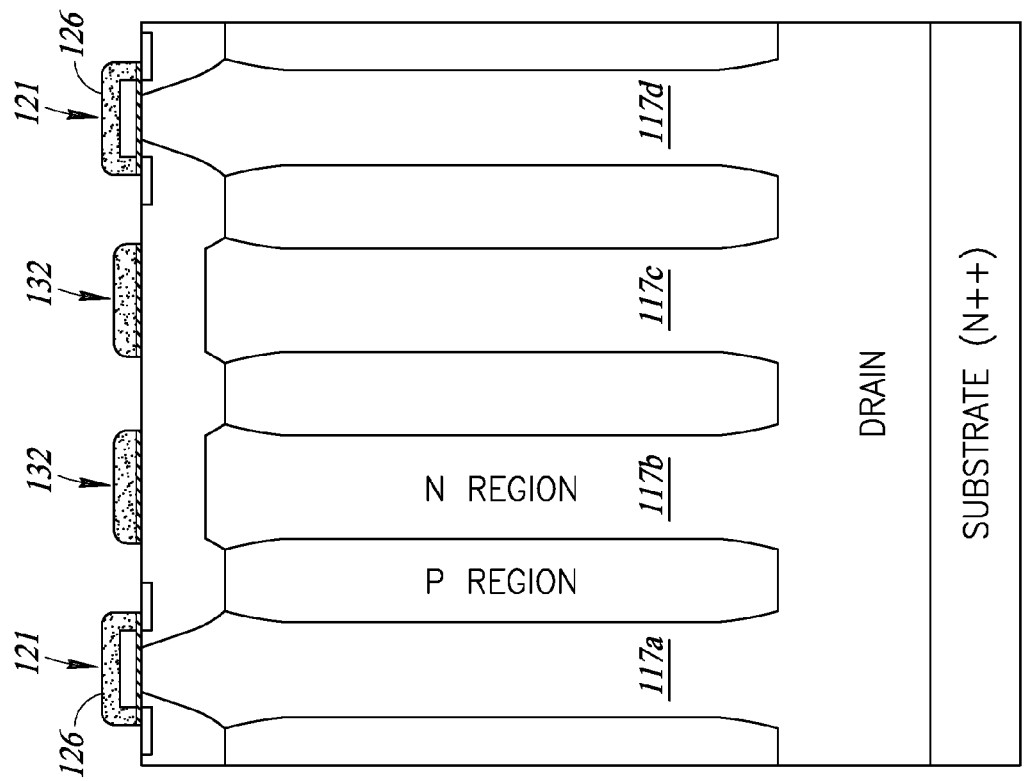

As shown in FIG. 4J, a metal layer 134 is applied to cover exposed upper surfaces of the structure shown in FIG. 4I. The metal layer 134 may be deposited, for example, by sputtering, photolithography or the like to form a layer covering the exposed upper surfaces of the gate structures 121, dummy gate structures 132 (if present), body regions 118 and source regions 120. The metal layer 134 may be formed of any suitable metal, and in one or more embodiments, the metal layer 134 may include aluminum or an aluminum alloy. Further, in one or more embodiments, the deposited metal layer 134 may be patterned and shaped as desired by photolithography or the like.

Figure 4K:
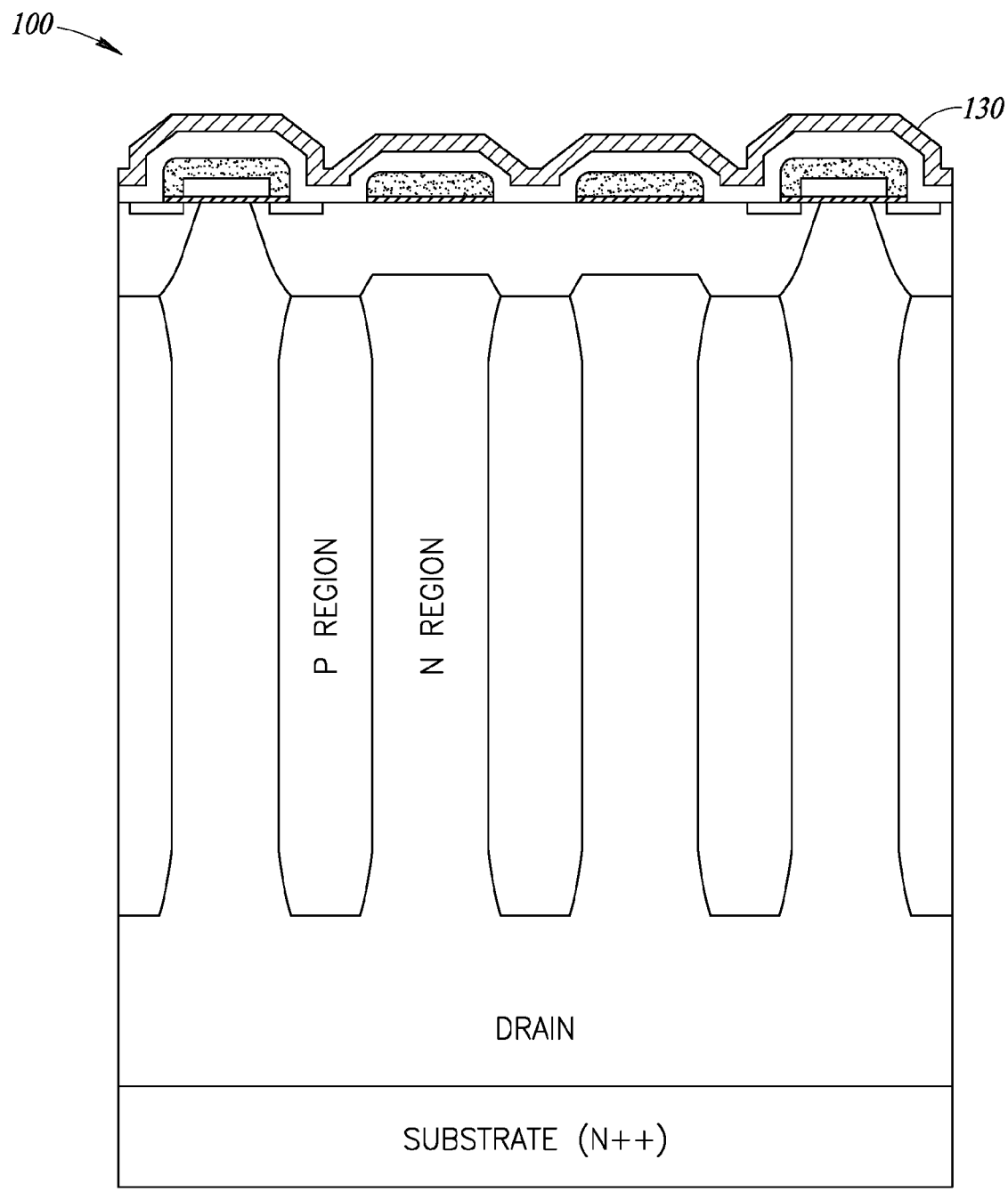

A passivation layer 130 may be formed on and covering the metal layer 134, as shown in FIG. 4K. The passivation layer 130 may be, for example, an oxide or nitride layer, and in some embodiments may include a metal oxide.

After forming the passivation layer 130, the structure shown in FIG. 4K is obtained, which corresponds to the super junction semiconductor device 10 of FIG. 2.

Figure 5:
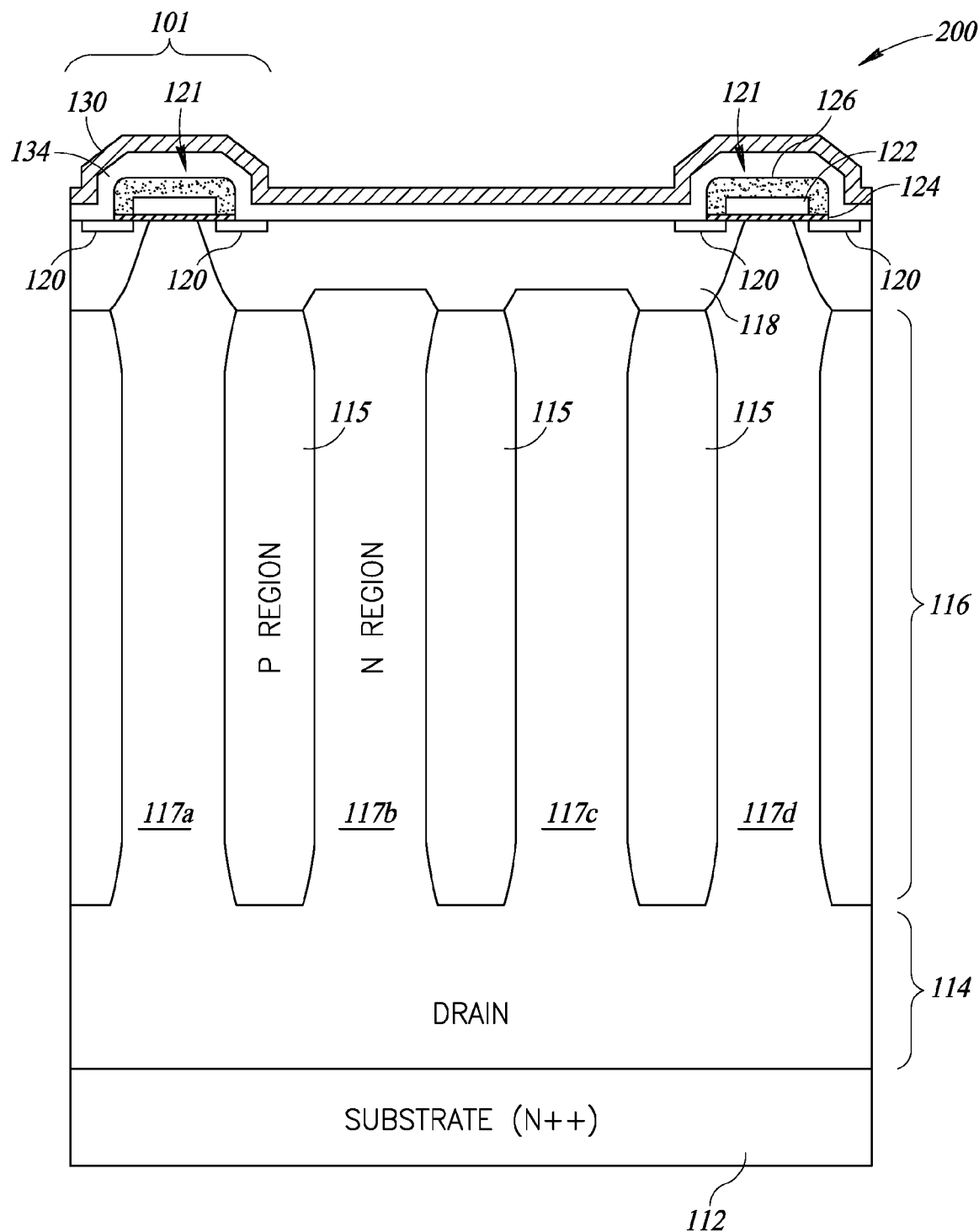
FIG. 5 is a cross-sectional view of a super-junction semiconductor device, in accordance with another exemplary embodiment of the present disclosure.

FIG. 5 is a cross-sectional view of a super-junction semiconductor device 200, in accordance with another exemplary embodiment of the present disclosure. The super-junction semiconductor device 200 of FIG. 5 is similar in structure and function to the super-junction semiconductor device 100 of FIG. 2, except for the difference that will be discussed below. The features shared by the devices 100 and 200 will not be described herein again in the interest of brevity.

The difference between the super-junction semiconductor device 200 shown in FIG. 5 and the super-junction semiconductor device 100 shown in FIG. 2 is that the dummy gate structures 132 are not included in the device 200 of FIG. 5. Instead, the inactive region (e.g., the region including inactive n-type columns 117b, 177c) is covered with the metal layer 134 and the passivation layer 130, without forming dummy gate structures.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A semiconductor device, comprising:
a substrate;
a drain region on the substrate, the drain region having a first conductivity type;
a plurality of first columns on the drain region, the first columns having the first conductivity type;
a plurality of second columns on the drain region, the second columns having a second conductivity type, each of the second columns being positioned between respective first columns;
first and second gate structures overlying respective ones of the first columns; and
a body region having the second conductivity type, the body region extending between the first and second gate structures and abutting at least two second columns of the plurality of second columns, and at least one inactive first column of the plurality of first columns, the at least one inactive first column being positioned between the at least two second columns.

2. The semiconductor device of claim 1, further comprising:
first and second source regions formed in the body region, the first and second source regions having the first conductivity type.

3. The semiconductor device of claim 1, further comprising:
a dummy gate structure overlying the at least one inactive first column abutting the body region.

4. The semiconductor device of claim 3, wherein the dummy gate structure includes:
a gate oxide region; and
a gate dielectric region on the gate oxide region.

5. The semiconductor device of claim 1 wherein each of the first and second gate structures includes:
a gate oxide region;
a gate electrode on the gate oxide region; and
a gate dielectric covering the gate electrode.

6. The semiconductor device of claim 5, further comprising:
a metal layer covering the first and second gate structures and coupled to the first and second source regions.

7. The semiconductor device of claim 6, further comprising a passivation layer covering the metal layer.

8. The semiconductor device of claim 1 wherein the first conductivity type is n-type and the second conductivity type is p-type.

9. A semiconductor device, comprising:
first and second super-junction transistors, each of the first and second super-junction transistors including:
a respective gate structure overlying a respective first column having a first conductivity type, and
a respective pair of second columns having a second conductivity type, the respective first column being sandwiched between the respective pair of second columns;
an inactive region positioned between the first and second super-junction transistors, the inactive region including at least one inactive column having the first conductivity type; and
a body region extending between the respective first columns of the first and second super-junction transistors and abutting the at least one column of the inactive region.

10. The semiconductor device of claim 9 wherein the first super-junction transistor includes a first source region formed in the body region, and the second super-junction transistor includes a second source region formed in the body region, the first and second source regions having the first conductivity type.

11. The semiconductor device of claim 9 wherein the inactive region includes a dummy gate structure overlying the at least one inactive column.

12. The semiconductor device of claim 9 wherein each of the respective gate structures includes:
a gate oxide region;
a gate electrode on the gate oxide region; and
a gate dielectric covering the gate electrode.

13. A method, comprising:
forming a first gate structure over a first column of semiconductor material having a first conductivity type, the first column being sandwiched between a first pair of columns of semiconductor material having a second conductivity type;

forming a second gate structure over a second column of semiconductor material having the first conductivity type, the second column being sandwiched between a second pair of columns of semiconductor material having the second conductivity type; and forming a body region extending between the first and second gate structures and extending between the first and second columns of semiconductor material having the first conductivity type, the body region abutting an inactive third column of semiconductor material having the first conductivity type that is positioned between the first and second pairs of columns of semiconductor material having the second conductivity type.

14. The method of claim 13, further comprising:
forming a first source region in the body region, the first source region being proximate the first gate structure; and
forming a second source region in the body region, the second source region being proximate the second gate structure.

15. The method of claim 14, further comprising:
forming a metal layer over the first and second gate structures and abutting the first and second source regions.

16. The method of claim 13 wherein forming the body region includes:
implanting dopants of the second conductivity type in a layer of semiconductor material of the first conductivity type overlying the first and second pairs of columns of semiconductor material having the second conductivity type; and
diffusing the implanted dopants to form the body region.

17. The method of claim 13 wherein forming the first and second gate structures includes:
forming first and second gate oxide regions;
forming first and second gate electrodes on the first and second gate oxide regions, respectively; and
forming first and second gate dielectric regions covering the first and second gate electrodes, respectively.

18. The method of claim 13, further comprising:
forming a dummy gate structure over the inactive third column of semiconductor material having the first conductivity type.

19. The method of claim 18 wherein forming the dummy gate structure includes:
forming a dummy gate oxide region; and
forming a dummy gate dielectric region over the dummy gate oxide region.

20. The method of claim 13 wherein forming a body region includes:
forming the body region extending between the first and second columns of semiconductor material having the first conductivity type, the body region abutting at least two inactive columns of semiconductor material having the first conductivity type that are positioned between the first and second pairs of columns of semiconductor material having the second conductivity type.

21. The semiconductor device of claim 1 wherein the at least one inactive first column is positioned between a pair of super-junction transistors.

22. The method of claim 13 wherein the inactive third column is formed between a pair of super-junction transistors.

* * * * *